(12) United States Patent
Kitagawa et al.

(10) Patent No.: US 10,219,383 B2
(45) Date of Patent: Feb. 26, 2019

(54) PRINTED WIRING BOARD AND METHOD FOR MANUFACTURING THE SAME

(71) Applicant: IBIDEN CO., LTD., Ogaki (JP)

(72) Inventors: Katsutoshi Kitagawa, Ogaki (JP); Takema Adachi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/924,412

(22) Filed: Mar. 19, 2018

(65) Prior Publication Data
US 2018/0270958 A1 Sep. 20, 2018

(30) Foreign Application Priority Data

Mar. 17, 2017 (JP) .................. 2017-053258

(51) Int. Cl.
*H05K 1/18* (2006.01)
*H05K 1/11* (2006.01)
(Continued)

(52) U.S. Cl.
CPC ....... *H05K 1/183* (2013.01); *H01L 27/14636* (2013.01); *H05K 1/113* (2013.01); *H05K 1/181* (2013.01); *H05K 3/0032* (2013.01); *H05K 3/108* (2013.01); *H05K 3/184* (2013.01); *H05K 3/188* (2013.01); *H05K 3/424* (2013.01); *H05K 3/429* (2013.01); *H05K 3/4644* (2013.01); *H05K 3/4697* (2013.01); *H01L 27/14634* (2013.01); *H05K 2201/096* (2013.01); *H05K 2201/0949* (2013.01); *H05K 2201/09063* (2013.01); *H05K 2201/09072* (2013.01); *H05K 2201/09536* (2013.01); *H05K 2201/09845* (2013.01); *H05K 2201/10121* (2013.01); *H05K 2201/10151* (2013.01); *H05K 2201/10522* (2013.01); *H05K 2201/10545* (2013.01);
(Continued)

(58) Field of Classification Search
CPC .. H05K 3/00; H05K 3/10; H05K 3/18; H05K 3/42; H05K 3/46
USPC ....... 174/261, 251, 255, 256, 258, 260, 262; 438/66, 110, 613; 385/14; 1/1
See application file for complete search history.

(56) References Cited

U.S. PATENT DOCUMENTS 6,144,507 A * 11/2000 Hashimoto ............. H01L 24/81
257/680
6,339,197 B1 * 1/2002 Fushie ................ H01L 23/5384
174/255
(Continued)

FOREIGN PATENT DOCUMENTS

JP 2014-103401 A 6/2014

*Primary Examiner* — Xiaoliang Chen
(74) *Attorney, Agent, or Firm* — Oblon, McClelland, Maier & Neustadt, L.L.P.

(57) ABSTRACT

A printed wiring board includes a laminate including resin insulating layers and conductor layers such that the resin insulating layers and the conductor layers are laminated alternately and that the laminate has a through hole opening to a first surface of the laminate and a component accommodating cavity that accommodates an electronic component and having an opening part formed on a second surface of the laminate on the opposite side with respect to the first surface. The through hole is formed through the laminate such that the through hole is extending to the component accommodating cavity, and the laminate has a resin coating formed on an inner wall surface of the through hole.

15 Claims, 7 Drawing Sheets

(51) Int. Cl.
   *H05K 3/00* (2006.01)
   *H05K 3/10* (2006.01)
   *H05K 3/18* (2006.01)
   *H05K 3/46* (2006.01)
   *H05K 3/42* (2006.01)
   *H01L 27/146* (2006.01)

(52) U.S. Cl.
   CPC ............ *H05K 2203/0554* (2013.01); *H05K 2203/072* (2013.01); *H05K 2203/0723* (2013.01); *H05K 2203/107* (2013.01)

(56) References Cited

U.S. PATENT DOCUMENTS

| | | | | |
|---|---|---|---|---|
| 7,723,146 B2 * | 5/2010 | Chow | ............... | H01L 27/14618 257/100 |
| 7,768,125 B2 * | 8/2010 | Chow | ................ | H01L 21/6836 257/738 |
| 9,880,327 B2 * | 1/2018 | Park | ................... | H04N 5/23287 |
| 2004/0212030 A1 * | 10/2004 | Asai | ................... | G02B 6/12002 257/432 |
| 2006/0012967 A1 * | 1/2006 | Asai | ........................ | G02B 6/43 361/764 |
| 2006/0263003 A1 * | 11/2006 | Asai | ..................... | G02B 6/4204 385/14 |
| 2007/0223935 A1 * | 9/2007 | Asai | ........................ | G02B 6/43 398/164 |
| 2008/0170819 A1 * | 7/2008 | Kodama | ................ | G02B 6/138 385/14 |
| 2008/0236876 A1 * | 10/2008 | Kodama | ................... | G02B 6/43 174/260 |
| 2008/0247703 A1 * | 10/2008 | Kodama | ............... | G02B 6/4204 385/14 |
| 2008/0247704 A1 * | 10/2008 | Kodama | ............... | G02B 6/4204 385/14 |
| 2008/0285910 A1 * | 11/2008 | Yamada | ............. | G02B 6/12002 385/14 |
| 2009/0016671 A1 * | 1/2009 | Asai | ........................ | G02B 6/43 385/14 |
| 2012/0217607 A1 * | 8/2012 | Hanai | ............... | H01L 27/14618 257/448 |
| 2015/0036349 A1 * | 2/2015 | Tsuchiya | ................ | H01L 33/60 362/294 |
| 2016/0021755 A1 * | 1/2016 | Lee | ........................ | H05K 1/185 174/251 |
| 2016/0293537 A1 * | 10/2016 | Sugiyama | ............... | H01L 23/13 |
| 2017/0315274 A1 * | 11/2017 | Park | ........................ | G02B 3/14 |

* cited by examiner

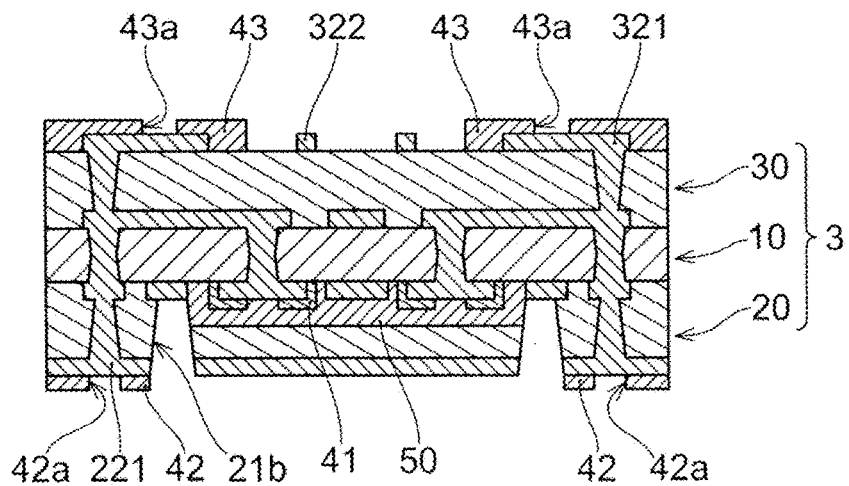
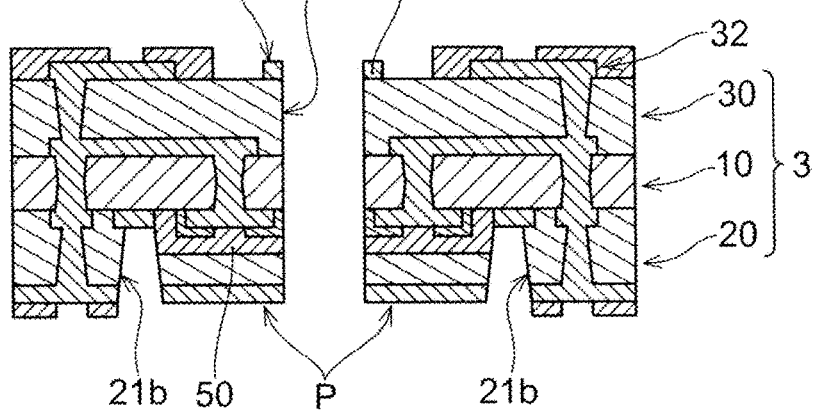
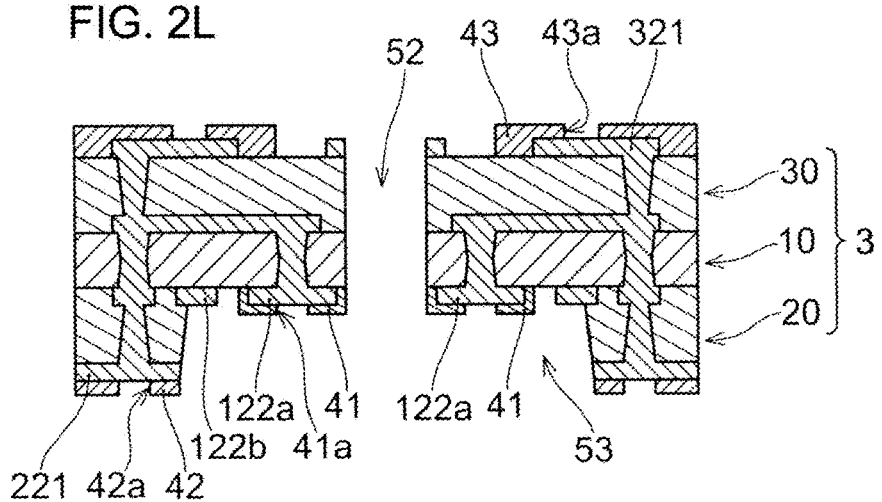

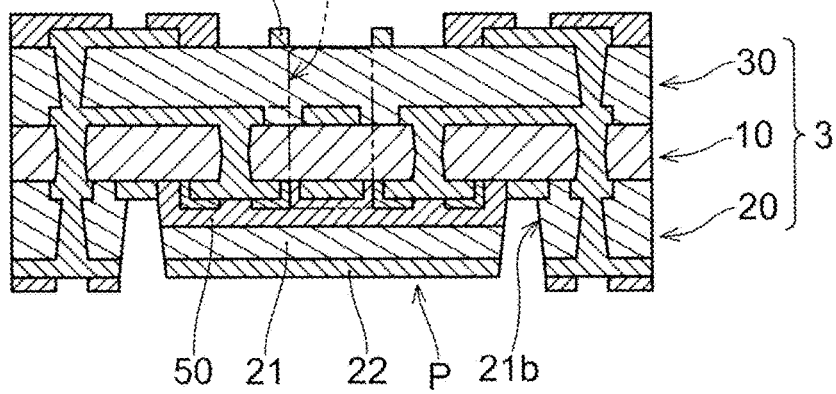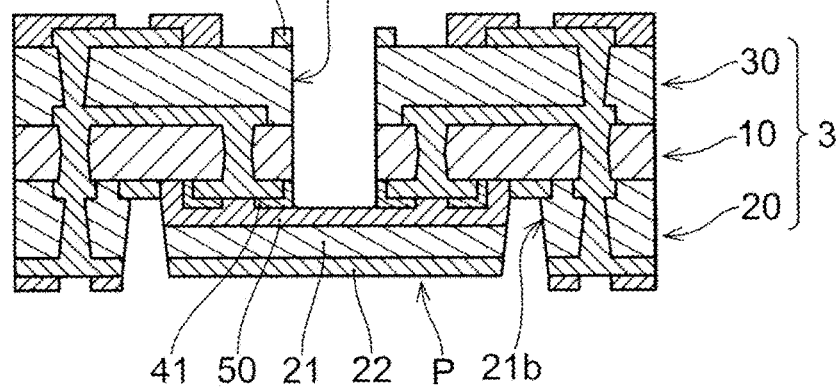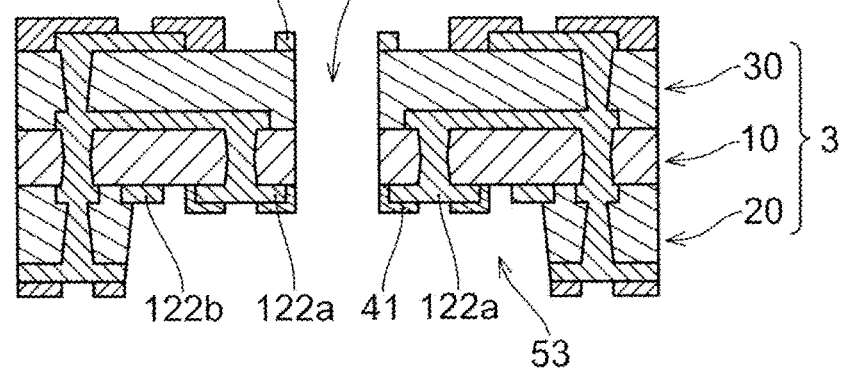

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2017-053258, filed Mar. 17, 2017, the entire contents of which are incorporated herein by reference.

BACKGROUND OF THE INVENTION

Field of the Invention

The present invention relates to a printed wiring board and a method for manufacturing the printed wiring board.

Description of Background Art

Japanese Patent Laid-Open Publication No. 2014-103401 describes a sensor element module in which a sensor element chip is mounted on an opening part of a first insulating layer having the opening part such that a functional surface is on the opening part side. A second insulating layer is pasted to the first insulating layer with a conductor pattern interposed therebetween so as to cover a side surface and a bottom surface of the sensor element chip. A lens is provided on a surface of the opening part on an opposite side with respect to the sensor element chip. Further, the first and second insulating layers each contain a reinforcing material such as a glass cloth in order to improve mechanical strength. The entire contents of this publication are incorporated herein by reference.

SUMMARY OF THE INVENTION

According one aspect of the present invention, a printed wiring board includes a laminate including resin insulating layers and conductor layers such that the resin insulating layers and the conductor layers are laminated alternately and that the laminate has a through hole opening to a first surface of the laminate and a component accommodating cavity that accommodates an electronic component and having an opening part formed on a second surface of the laminate on the opposite side with respect to the first surface. The through hole is formed through the laminate such that the through hole is extending to the component accommodating cavity, and the laminate has a resin coating formed on an inner wall surface of the through hole.

According another aspect of the present invention, a method for manufacturing a printed wiring board includes forming, on a core substrate including a resin insulating layer and conductor layers on one side and the opposite side of the resin insulating layer, an electronic component mounting pad structure on the one side of the core substrate, forming a release film on the electronic component mounting pad structure, forming build-up layers on the one side and the opposite side of the core substrate such that the laminate including the core substrate and the build-up layers is formed, applying laser upon the laminate such that a separation groove is cut in a portion of the laminate and that a side surface of the release film is exposed from a surface of the laminate on a side where the release film is formed, forming an opening in the laminate such that the opening penetrates at least the resin insulating layer of the core substrate from a first surface of the laminate on an opposite side with respect to a second surface of the laminate on the side where the release film is formed, removing a portion of one of the build-up layers formed on the release film together with the release film such that a component accommodating cavity is formed in the laminate, and forming a coating resin layer on an inner wall surface of the opening forming a through hole formed in the laminate such that the coating resin layer is formed on the inner wall surface of the through hole extending to the component accommodating cavity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2J is a cross-sectional view illustrating an example of the method for manufacturing the printed wiring board of the embodiment;

FIG. 2K is a cross-sectional view illustrating an example of the method for manufacturing the printed wiring board of the embodiment;

FIG. 2L is a cross-sectional view illustrating an example of the method for manufacturing the printed wiring board of the embodiment;

FIG. 3A illustrates another embodiment of a method for fondling a component accommodating cavity of FIG. 2L;

FIG. 3B illustrates the another embodiment of the method for forming the component accommodating cavity of FIG. 2L;

FIG. 3C illustrates the another embodiment of the method for forming the component accommodating cavity of FIG. 2L;

DETAILED DESCRIPTION OF THE EMBODIMENTS

Figure 1:
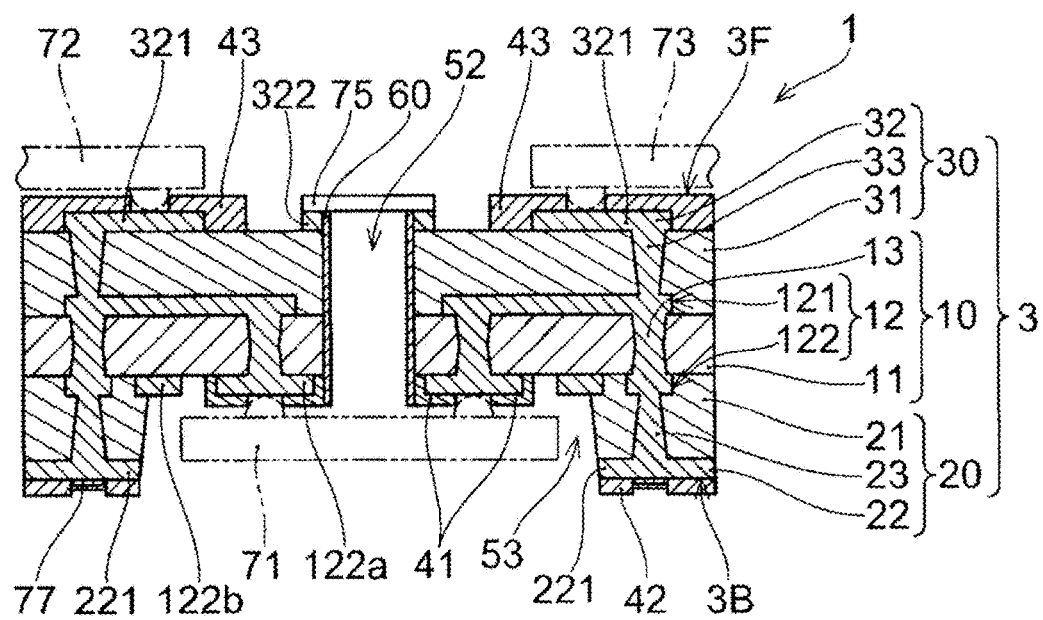
FIG. 1 is a cross-sectional view of a printed wiring board of an embodiment of the present invention.

Embodiments will now be described with reference to the accompanying drawings, wherein like reference numerals designate corresponding or identical elements throughout the various drawings.

FIG. 1 illustrates a cross-sectional view of a printed wiring board 1 according to an embodiment of the present invention. The printed wiring board 1 of the present embodiment includes a laminate 3 in which resin insulating layers (11, 21, 31) and conductor layers (12 (121, 122), 22, 32) are alternately laminated, and a component accommodating cavity 53 having an opening part on a second surface (3B) (a surface of the second conductor layer 22) which is a surface on an opposite side with respect to a first surface (3F) (a surface of the third conductor layer 32) which is a surface of the laminate 3. Further, the printed wiring board 1 has a through hole 52 that opens to the first surface (3F) of the laminate 3 and leads to the component accommodating cavity 53. A resin coating 60 is formed on an inner wall surface of the through hole 52. In the example illustrated in FIG. 1, an attaching part 322 for attaching a plate-like member 75 such as a lens is attached around the through hole 52 on the first surface (3F) side. In the example illustrated in FIG. 1, the attaching part 322 is forming by a portion of the third conductor layer 32. However, it is also possible that the attaching part 322 is formed, for example, as a recess so as to allow the plate-like member 75 to be fitted therein. The recess may be formed by removing a portion of a solder resist layer 43 at the position of the attaching part 322, or may be formed by providing a cutout portion in the resin insulating layer 31. As illustrated in FIG. 1, the component accommodating cavity 53 has a lateral width larger than that of the through hole 52 and a depth smaller than a height of the through hole 52. That is, the component accommodating cavity 53 is formed with a lower aspect ratio than the through hole 52.

In FIG. 1, for example, an electronic component 71 such as an image sensor chip, and other electronic components (72, 73) attached to the printed wiring board are indicated using two-dot chain lines.

The resin insulating layers (the first resin insulating layer 11, the second resin insulating layer 21, and the third resin insulating layer 31) are each an insulating layer having conductor layers (the first conductor layers 12 (121, 122), the second conductor layer 22, and the third conductor layer 32) on both sides thereof. The resin insulating layers (11, 21, 31), for example, may each be formed by impregnating a core material (reinforcing material) such as glass fiber with a resin composition that contains a filler, and may each be formed using a resin composition alone that contains a filler. Further, the resin insulating layers (11, 21, 31) may each be formed to be a single layer, or may each be formed from multiple insulating layers. Examples of the resin include an epoxy resin and the like. The resin insulating layers (11, 21, 31) each have a thickness, for example, in a range of 25-100 μm. When any one of the resin insulating layers (for example, the first resin insulating layer 11) is used as a core substrate, the thickness of the resin insulating layer may be preferably greater than 100 μm.

The conductor layers (12, 22, 32) are not particularly limited, but can each be formed of a metal foil, or a seed layer formed by electroless plating or vacuum deposition or the like and an electrolytic plating film, or a composite film thereof. An example of a material that forms the conductor layers (12, 22, 32) is copper. Copper facilitates electrolytic plating and also has a low electrical resistance. However, the material of each of the conductor layers is not limited to copper. The conductor layers (12, 22, 32) each have a thickness, for example, of about 3-20 μm.

In the embodiment illustrated in FIG. 1, the laminate 3 is formed to have a laminated structure including a core substrate 10, a first build-up layer 20 and a second build-up layer 30. The laminate 3 is not limited to have one build-up layer (the build-up layer 20 or the build-up layer 30) on each of both sides of the core substrate 10, but may have multiple build-up layers on each of both sides of the core substrate 10. Through holes 13 connecting the first conductor layers 12 on both sides of the first resin insulating layer 11 to each other are formed in the core substrate 10. Further, patterns (a first pattern 121 on the first surface (3F) side and a second pattern 122 on the second surface (3B) side) of the first conductor layers 12 are respectively formed on both sides of the first resin insulating layer 11. The first and second patterns (121, 122) of the first conductor layers 12 that are respectively formed on the both sides are connected to each other by the through holes 13. As described later in an example of a manufacturing method, the core substrate 10 is formed, for example, by laminating a metal foil such as a copper foil on both sides of a prepreg and applying heat while applying pressure to respectively form the first conductor layers 12 on the both sides.

The through holes 13 are formed, for example, by forming a seed layer in through holes formed in the first resin insulating layer 11 by electroless plating and filling the through holes with electrolytic plating. However, the method for forming the through holes 13 is not limited to this method. It is also possible to fill the through holes with a paste-like conductive material and fire the conductive material. The through holes are each formed, for example, by sublimating a portion of the resin of the first resin insulating layer 11 by laser irradiation. In the example illustrated in FIG. 1, the through holes are each formed in half from each of the both sides of the first resin insulating layer 11. Therefore, the through holes are each formed to have a hourglass shape having a wide width on both surface sides and a narrow width on a center side.

The first conductor layers 12 (the first pattern 121 on one side and the second pattern 122 on the other side) formed on the both sides of the first resin insulating layer 11 are formed to have patterns according to a circuit to be formed. The first conductor layers 12 can also be formed using a method such as electrolytic plating at the same time as the formation of the through holes 13. The patterns can be formed using an additive method or a subtractive method or the like. In the second pattern 122, a frame-shaped land (122b) is formed as a laser stopper when electronic component mounting pads (122a) (to be described later) and the component accommodating cavity 53 (to be described later) are formed. The frame-shaped land (122b) is formed in a seamless continuous ring shape. Further, the first pattern 121 on one side is connected to the second pattern 122 on the other side by the through holes 13. In the example of FIG. 1, the electronic component mounting pads (122a) are connected to the second pattern 122 formed on an outer side of the component accommodating cavity 53 via the first pattern 121. That is, the electronic component mounting pads (122a) are connected to the second pattern 122 by bypassing the frame-shaped land (122b) through the inside of the first resin insulating layer 11 which forms a bottom surface of the component accommodating cavity 53.

The first build-up layer 20 is formed on the other side of the core substrate, that is, on the second surface (3B) side of the laminate 3. On a surface of the second pattern 122 of the core substrate 10, the second resin insulating layer 21 is formed, for example, by laminating a film of a resin insulating material and a copper foil and applying heat and pressure. Then, for example, by forming a copper plating film on the copper foil, the second conductor layer 22 is formed. Further, via conductors 23 are formed at connecting portions between the first conductor layer 12 and the second conductor layer 22. The via conductors 23 and the second conductor layer 22 can be formed using the same method as that for the formation of the conductors for the through holes 13 and the first conductor layers 12 of the core substrate 10 described above. It is possible that two or more first build-up layers 20 are formed. Further, in the first build-up layer 20, the component accommodating cavity 53 to be described later is formed. On the electronic component mounting pads (122a) exposed in the component accommodating cavity 53, for example, an electronic component 71 such as an image sensor chip, can be mounted. The electronic component mounting pads (122a), together with the frame-shaped land (122b) for stopping laser and other wirings and the like, are formed when the second pattern of the core substrate 10 is formed.

The second build-up layer 30 is formed on one side of the core substrate, that is, on the first surface (3F) side of the laminate 3. The second build-up layer 30 is formed in the same way as the first build-up layer 20, and includes the third resin insulating layer 31, the third conductor layer 32, and via conductors 33. It is also possible that two or more second build-up layers 30 are formed. The through hole 52 is formed at an inner peripheral portion of the second build-up layer 30, and the resin coating 60 is formed on an exposed surface which is an inner wall surface of the through hole 52. In the third conductor layer 32, pads 321 connecting to the other electronic components (72, 73) or the like such as capacitors are formed. Further, in the example illustrated in FIG. 1, the attaching part 322 for attaching the plate-like member (a window formed of a translucent material or the like) 75 is formed. As described above, the attaching part 322 does not have to be such a conductor layer. For example, the attaching part 322 may be formed by a step formed by the solder resist layer 43, or may be formed by a recess or the like formed in the resin insulating layer 31. It is thought that such an attaching part 322 facilitates arrangement or bonding of the plate-like member 75. Further, it is possible to attach the plate-like member 75 to the printed wiring board 1 such that a surface of the plate-like member 75 is flush with surfaces of the solder resist layer 43 and the third resin insulating layer. For example, it is thought that the plate-like member 75 forming a lens or the like is unlikely to receive a mechanical impact from the outside. Patterning of the third conductor layer 32 can be formed in the same way as the above-described patterning of the first conductor layers 12.

On the electronic component mounting pads (122a) of the first conductor layer 12 and exposed portions of the second conductor layer 22 and the third conductor layer 32, solder resist layers (41, 42, 43) having openings (41a) (see FIG. 2D) and openings (42a, 43a) (see FIG. 2J) are respectively formed. The solder resist layers (41-43) can each be formed of, for example, an epoxy resin or the like, and can each be formed by patterning after being formed on an entire surface, for example, by screen printing, spray coating, roll coating, or film lamination.

The resin coating 60 is formed on the inner peripheral surface of the through hole 52 formed at center portions of the second build-up layer 30 and the core substrate 10. For example, the resin coating 60 can be formed using a method in which an epoxy resin or the like is applied or is sprayed using a spray. As a material of the resin coating 60, a silicone-based resin material, an acrylic resin material or the like can be used. The resin coating 60 is formed in order to prevent materials of the resin insulating layers (11, 31) from falling down as dust due to roughness of a grinding surface formed using a drill or the like when the through hole 52 is formed at the center portions of the second build-up layer 30 and the core substrate 10. That is, when a portion of the first and third resin insulating layers (11, 31) is scraped off and the surface is roughened, a part of the material is likely to peel off and fall down. Particularly in the case of resin insulating layers in which a reinforcing material such as a glass cloth is embedded, a part of the glass cloth or a part of the resin composition in a vicinity thereof can easily fall like dust. In order to prevent such a problem, the resin coating 60 is formed so as to cover the rough processed surface. Therefore, the resin coating 60 does not have a surface subjected to machining, but is preferably a coating having a surface as formed by coating, sputtering or the like.

For the conductor layers (12, 22, 32), on the surfaces of the conductor layers (12, 22, 32) that are exposed for connecting to an electronic component and the like, for example, a surface protective film 77 is formed from a plating film of Ni/Au, Ni/Pd/Au, Sn or the like (illustration of the surface protective film on the conductor layers (12, 32) is omitted). It is also possible that the surface protection film 77 is an OSP formed by immersion in a liquid protective material or the like. Sensor elements such as an image sensor chip 71 and electronic components (72, 73) such as capacitors are mounted via solder bumps or the like on the printed wiring board 1 using a flip-chip method or the like. Further, although not illustrated in the drawings, the same plating film as the surface protective film 77 on the conductor layer 22 may be formed on an inner wall surface of the component accommodating cavity 53. The plating film on the inner wall surface of the component accommodating cavity 53 can be formed by forming the surface protective film 77 on the conductor layer 22 without covering the inner wall of the component accommodating cavity 53 with a resist or the like.

Figure 2A:
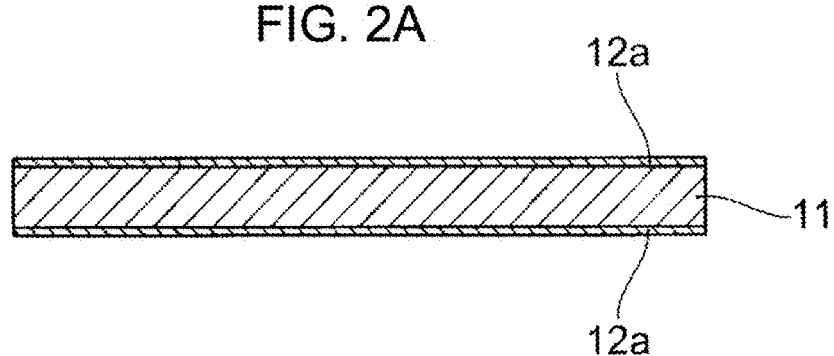
FIG. 2A is a cross-sectional view illustrating an example of a method for manufacturing the printed wiring board of the embodiment.
Figure 2B:
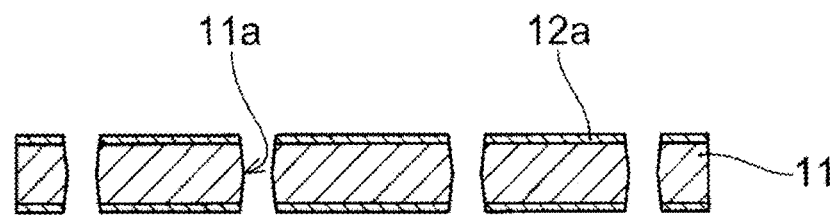
FIG. 2B is a cross-sectional view illustrating an example of the method for manufacturing the printed wiring board of the embodiment.
Figure 2C:
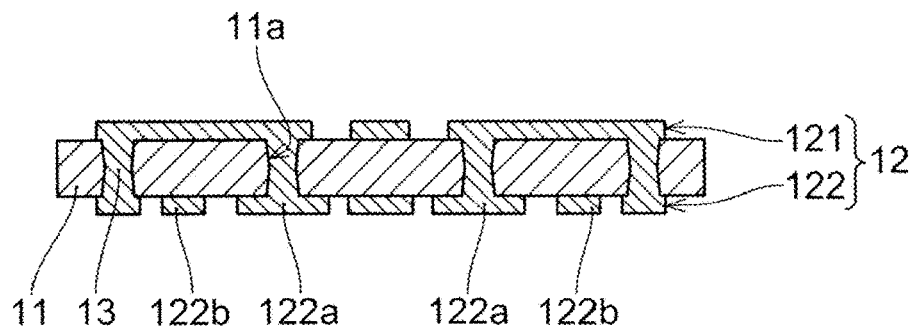
FIG. 2C is a cross-sectional view illustrating an example of the method for manufacturing the printed wiring board of the embodiment.

A method for manufacturing the printed wiring board 1 illustrated in FIG. 1 is described with reference to FIG. 2A-2N. First, as illustrated in FIG. 2A-2C, the electronic component mounting pads (122a) are formed on the other side of the core substrate that respectively has the first conductor layers 12 (the first pattern 121 and the second pattern 122) on both sides (one side and the other side which is on an opposite side with respect to the one side) of the resin insulating layer 11. That is, as illustrated in FIG. 2A, a double-sided copper-clad laminated plate including the first resin insulating layer 11 and copper foils (12a) that are respectively pasted to both sides of the first resin insulating layer 11 is prepared. A material of the first resin insulating layer 11 is not particularly limited as long as the material has an appropriate rigidity and an electrical insulation property. For example, the first resin insulating layer 11 is formed of a glass epoxy material obtained by curing a material obtained by impregnating a reinforcing material such as a glass fiber with a resin material such as epoxy. The resin material such epoxy may contain inorganic filler such as silica at an appropriate content. It is also possible that, as the first resin insulating layer 11, a substrate formed of an insulating material that has not been bonded to a copper foil or the like is prepared.

Then, as illustrated in FIG. 2B, through holes (11a) are formed in the first resin insulating layer 11 at portions connecting between the first conductor layers 12 (the first pattern 121 on one side of the resin insulating layer 11, and the second pattern 122 on the other side of the resin insulating layer 11) formed on the both sides of the first resin insulating layer 11. The through holes (11a) are formed, for example, by laser irradiation or the like. In the example illustrated in FIG. 2B, the through holes (11a) are each formed substantially in half from each of both sides of the first resin insulating layer 11 by irradiating laser from each of both sides of the first resin insulating layer 11. Therefore, the through holes (11a) are each formed to have a hourglass shape that is a wide on both surface sides and narrow on a center side of the first resin insulating layer 11. Examples of kinds of laser include, but are not limited to, CO2 laser, YAG laser and the like.

Next, as illustrated in FIG. 2C, the first pattern 121 of the first conductor layer 12 is formed on the first surface (3F) (see FIG. 1) side of the laminate 3, which is one side of the core substrate 10. Further, the second pattern 122 having the electronic component mounting pads (122a) and the frame-shaped land (122b) for a laser stopper is formed on the other side of the core substrate 10. The electronic component mounting pads (122a) are pads for mounting an electronic component such as an image sensor chip to be described later. Further, the frame-shaped land (122b) for a laser stopper prevents laser from entering the first resin insulating layer 11 when the component accommodating cavity 53 (see FIG. 1) to be described later is formed. Therefore, the frame-shaped land (122b) is preferably formed in a frame-shaped pattern over the entire circumference around the component accommodating cavity 53 on an outer side of the electronic component mounting pads (122a). However, when the frame-shaped land (122b) is formed over the entire circumference of the component accommodating cavity 53, it is not possible to directly connect the electronic component mounting pads (122a) to other conductor patterns or the like on an outer side of the frame-shaped land (122b) on the same conductor layer (the second pattern 122) as the electronic component mounting pads (122a). Therefore, the electronic component mounting pads (122a) are connect to the other pads by bypassing the frame-shaped land (122b) by being connected to the first pattern 121 via the through holes 13 formed in the first resin insulating layer 11. The first pattern 121, the second pattern 122 and the conductors for the through holes 13 are formed, for example, by electrolytic plating using a semi-additive method.

Specifically, the first and second patterns (121, 122) and the conductors of the through holes 13 are formed, for example, by forming a copper coating by electroless plating or the like, forming a plating resist film, and forming an electrolytic plating film by electrolytic plating using the copper coating as a seed layer. Thereafter, the plating resist film (not illustrated in the drawings) is removed. Further, portions of the copper foil (12a) and the copper coating formed by electroless plating at where the plating resist film is formed are removed by etching. Thereby, the patterns (121, 122) of the first conductor layers 12 are formed. As a result, as illustrated in FIG. 2C, the through holes 13 are formed by filling the through holes (11a) with a copper plating film, and the first pattern 121 and the second pattern 122 of the first conductor layers 12 are respectively formed on both sides of the resin insulating layer 11. Pads and wirings including the above-described electronic component mounting pads (122a) and the frame-shaped land (122b) for a laser stopper are formed in the second pattern 122. It is also possible that the first conductor layers 12 and the through holes 13 are not formed using such a semi-additive method, but are formed using a subtractive method or a full-additive method.

Figure 2D:
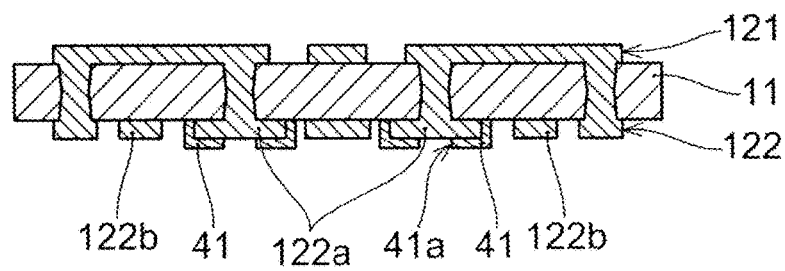
FIG. 2D is a cross-sectional view illustrating an example of the method for manufacturing the printed wiring board of the embodiment.

Then, as illustrated in FIG. 2D, a solder resist layer 41 is formed on peripheral edges of the electronic component mounting pads (122a). The solder resist layer 41 prevents solder or the like from flowing to an unnecessary place when an electronic component is mounted on the electronic component mounting pads (122a). An opening (41a) is formed on each portion to be bonded due to mounting, and a portion of each of the electronic component mounting pads (122a) is exposed. The solder resist layer 41 is formed, for example, by coating or pasting a film on the entire surface of the second pattern 122, and is then patterned to remove unnecessary portions thereof, and thereby is formed only on peripheral edges of the electronic component mounting pads (122a).

Figure 2E:
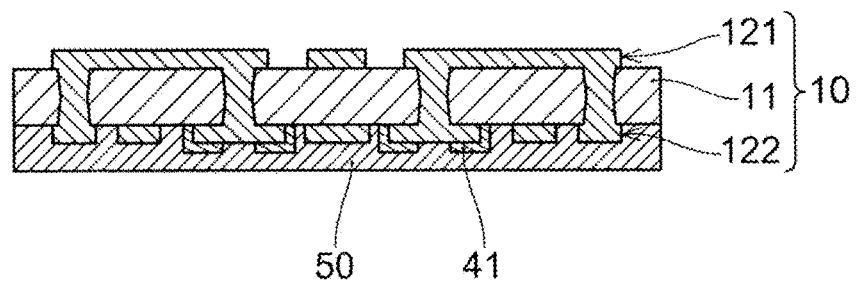
FIG. 2E is a cross-sectional view illustrating an example of the method for manufacturing the printed wiring board of the embodiment.
Figure 2F:
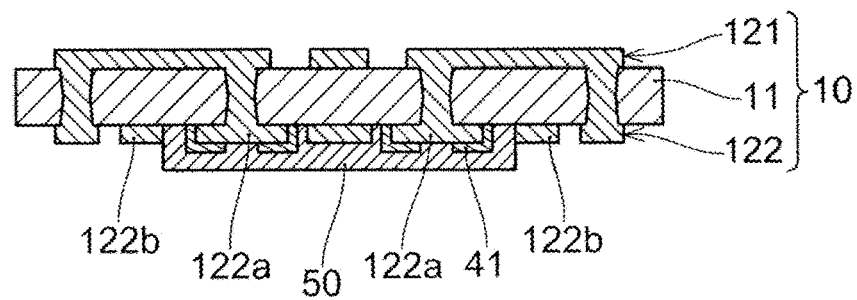
FIG. 2F is a cross-sectional view illustrating an example of the method for manufacturing the printed wiring board of the embodiment.

Next, a release film 50 is formed on the second pattern 122 such as the electronic component mounting pads (122a) and on the first resin insulating layer 11 around the second pattern 122. Specifically, as illustrated in FIG. 2E-2F, a release film material (50a) composed of, for example, a polyimide resin, a silicone resin, a fluorine resin or the like is provided on the entire surface of the core substrate 10 on the second pattern 122 side. Then, unnecessary portions of the release film material (50a) are cut and peeled off, and thereby the release film 50 is formed at desired places. The release film 50 is formed in order to expose portions of the electronic component mounting pads (122a) by removing a portion of the first build-up layer 20 (see FIG. 2I) which is laminated on the second pattern 122 side after this. Therefore, the release film 50 is formed on the electronic component mounting pads (122a) and peripheral edge portions thereof such that the second resin insulating layer 21 (see FIG. 2G) does not remain on the electronic component mounting pads (122a) and the peripheral edge portions thereof. That is, since a separation groove (21b) is formed by cutting, using laser, around a to-be-removed portion (P) (see FIG. 2H) of the first build-up layer 20, the release film 50 is formed extending to a position where the frame-shaped land (122b) for stopping laser penetration is just exposed. Therefore, the release film 50 is preferably formed of a material that can be easily peeled off without strongly adhering to the solder resist layer 41, the first conductor layer 12 and the first resin insulating layer 11. However, the material of the release film 50 preferably can adhere to the solder resist layer 41, the first conductor layer 12 and the first resin insulating layer 11 to such an extent that penetration of a liquid can be prevented. Examples of the material of the release film 50 include, in addition to the above-described examples, non-silicone-based resins that do not each contain a silicone resin or the like, acrylic resins, and the like.

Figure 2G:
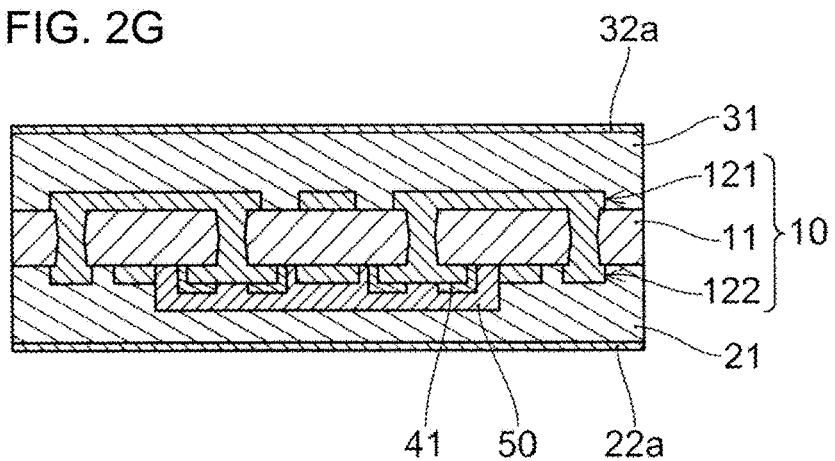
FIG. 2G is a cross-sectional view illustrating an example of the method for manufacturing the printed wiring board of the embodiment.

Thereafter, the build-up layers (20, 30) are respectively formed on both sides of the core substrate 10, and the laminate 3 is formed. Specifically, first, as illustrated in FIG. 2G, a prepreg which is a resin material of the third resin insulating layer 31 on one side of the core substrate 10 and a resin material of the second resin insulating layer 21 on the other side of the core substrate 10, together with copper foils (32a, 22a), is laminated, and the resulting structure is pressed and heated. By curing the prepreg, the second resin insulating layer 21 and the third resin insulating layer 31 are respectively formed on the first conductor layers 12, and the copper foils (22a, 32a) are respectively bonded to surfaces thereof. The material of the second and third resin insulating layers (21, 31) is also the same as that of the above-described first resin insulating layer of the core substrate 10. As a result, the second resin insulating layer 21 is laminated on exposed surfaces of the second pattern 122 and the first resin insulating layer 11 of the core substrate and on a surface of the release film 50. The third resin insulating layer 31 is formed on exposed surfaces of the first pattern 121 and the first resin insulating layer 11 of the core substrate 10. Similar to the copper foil formed on both sides of the first resin insulating layer 11, for the copper foils (22a, 32a), a copper foil having a thickness of about several μm is used. It is also possible that a metal foil other than a copper foil is used. Further, it is also possible that, instead of the prepreg and the copper foils (22a, 32a), a copper foil coated with a resin that contains or does not contain a glass fiber or the like is use.

Figure 2H:
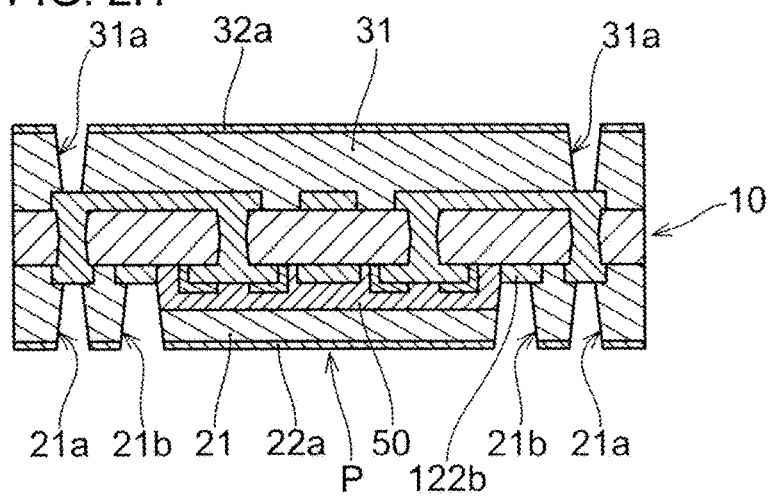
FIG. 2H is a cross-sectional view illustrating an example of the method for manufacturing the printed wiring board of the embodiment.

Patterns including wirings and pads are respectively formed on surfaces of the second resin insulating layer 21 and the third resin insulating layer 31. In order to respectively connect to the first conductor layers 12, openings (21a, 31a) are respectively formed in the second resin insulating layer 21 and the third resin insulating layer at portions connecting to the first conductor layers 12. The openings (21a, 31a) are formed by respectively irradiating laser from surfaces of the copper foils (22a, 32a) to sublimate the copper foils (22a, 32a) and the second and third resin insulating layers (21, 31) until the first conductor layers 12 are exposed. As a result, as illustrated in FIG. 2H, the openings (21a, 31a) each having a wide width on a surface side and a narrow width on the first conductor layer 12 side are respectively formed. In the example illustrated in FIG. 2H, when the conduction openings are formed, a cut-in groove (21b) for forming the component accommodating cavity 53 to be described later is formed in the second resin insulating layer 21. Similar to the conduction openings (21a), this cut-in groove (21b) is also formed by laser irradiation, and a laser beam is blocked by the frame-shaped land (122b). Therefore, for the laser, it is preferable to use CO2 laser having a wavelength of 9400 nm or 10640 nm which combines a high absorption rate due to an epoxy resin and a low absorption rate due to copper. Further, due to the cut-in groove (21b), a side surface of the release film 50 is exposed.

Figure 2I:
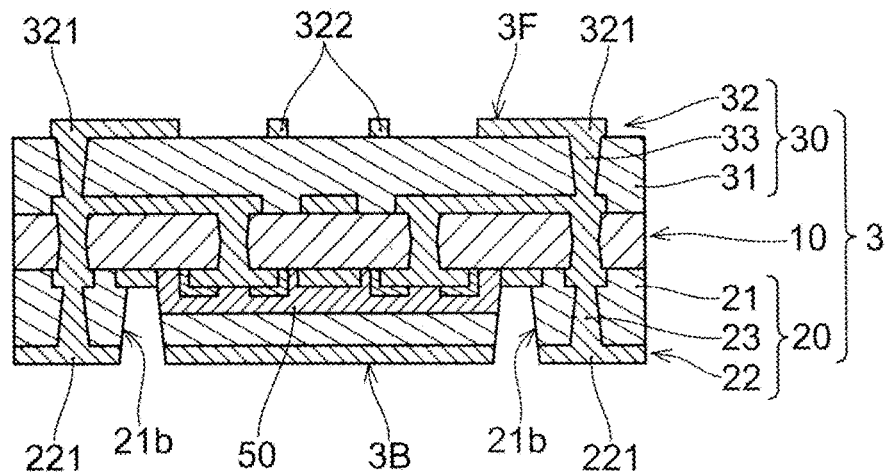
FIG. 2I is a cross-sectional view illustrating an example of the method for manufacturing the printed wiring board of the embodiment.

Thereafter, as illustrated in FIG. 2I, the second conductor layer 22 and the third conductor layer 32 are formed. As a result, the first build-up layer 20 is formed on the second pattern 122 side of the core substrate 10, and the second build-up layer 30 is formed on the first pattern 121 side of the core substrate 10. Specifically, as described above, for example, by copper electroless plating or the like, a copper coating is formed in the openings (21a, 31a), and, similar to the above-described formation of the first conductor layers 12, patterns including wirings and pads are formed using a semi-additive method. In this case, in the example illustrated in FIG. 2I, an electrolytic plating film is not formed in the cut-in groove (21b). However, it is also possible to form an electrolytic plating film on a wall surface of the cut-in groove (21b). When an electrolytic plating film is not to be formed in the cut-in groove (21b), electrolytic plating is performed in a state in which the cut-in groove (21b) is covered with a plating resist film. When an electrolytic plating film is formed also in the cut-in groove (21b), generation of dust from a processed surface of the second resin insulating layer 21 can be prevented, and a shield function can also be imparted.

As a result, as illustrated in FIG. 2I, the via conductors 23, 33 are respectively formed by filling the openings (21a, 31a) with a copper plating film, and the second conductor layer 22 and the third conductor layer 32 are respectively formed on surfaces of the second and third resin insulating layers (21, 31). The first build-up layer 20 is formed by the second resin insulating layer 21 and the second conductor layer 22, and the second build-up layer 30 is formed by the third resin insulating layer 31 and the third conductor layer 32, and thereby, the laminate 3 is formed. A surface of the second build-up layer 30 of the laminate 3 (a surface of the third conductor layer 32) is the first surface (3F), and a surface of the first build-up layer 20 (a surface of the second conductor layer 22) is the second surface (3B).

In the above description, the separation groove (21b) is formed when the openings (21a) for the via conductors are formed. However, it is also possible that the separation groove (21b) is formed after the second conductor layer 22 and the third conductor layer 32 are formed. That is, the separation groove (21b) may be formed by cutting a portion of the laminate 3 (the first build-up layer 20) using laser such that the side surface of the release film 50 is exposed from the second surface (3B) which is a surface of the laminate 3 on the side where the release film 50 is formed.

As illustrated in FIG. 2J, the solder resist layers (42, 43) having the openings (42a, 43a) at predetermined portions of pads 221 of the second conductor layer 22 and pads 321 of the third conductor layer 32 are respectively formed. The solder resist layers (42, 43) are each formed of the same material as the above-described solder resist layer 41 formed on the electronic component mounting pads (122a) of the first conductor layer 12. An electronic component, a circuit substrate or the like will be electrically connected to the openings (42a, 43a) of the solder resist layers (42, 43) in the future.

Next, an opening (52a) or an opening groove 55 (see FIG. 4B) is formed in the laminate 3 so as to penetrate at least the resin insulating layer 11 of the core substrate 10 from the first surface (3F) which is a surface on an opposite side with respect to the side of the laminate 3 where the release film 50 is formed. The opening (52a) may be formed to stop at a position where the resin insulating layer 11 of the core substrate 10, that is, at a position where the release film 50 or the second pattern 122 is exposed, or, as illustrated in FIG. 2K, may be formed to penetrate the release film 50 and the first build-up layer 20. The opening (52a) is fainted, for example, by performing a hollowing-out process using a router or drill. As illustrated in FIG. 2K, when the opening (52a) is formed penetrating through the laminate 3, the opening (52a) becomes the through hole 52. Further, even when the formation of the opening (52a) is stopped at the position of the release film 50, by removing the release film 50 and a portion of the first build-up layer 20 on the release film 50 thereafter, the opening (52a) can become the through hole 52. When the opening (52a) is formed penetrating through the first build-up layer 20 and the like, precise height control of a drill or the like and arrangement of a stopper pattern in the case where laser is used become unnecessary. The opening (52a) can be easily formed. In the example of FIG. 2K, the attaching part 322 for mounting the plate-like member 75 (see FIG. 1) such as a lens is formed by a conductor pattern of the third conductor layer 32 on an outer peripheral side of the opening (52a) on the first surface (3F) side of the third resin insulating layer 31.

Thereafter, as illustrated in FIG. 2L, by removing the release film 50 and removal portion (P) sandwiched between the separation groove (21b) of the first build-up layer 20 and the opening (52a), the component accommodating cavity 53 is formed in the laminate 3. The removal portions (P1, P2) can be removed using any method. For example, the removal portions (P1, P2) can be simply removed by being sucked to a jig tool or the like and pulled to an opposite side with respect to the first resin insulating layer 11. That is, as described above, since the release film 50 does not have strong adhesion with the first resin insulating layer 11 and the solder resist layer 41 and the like, the removal portions (P1, P2) can be easily separated and removed by being pulled. Even when a plating film formed at the time of forming the second conductor layer 22 is formed on an inner wall of the cut-in groove (21b), such a plating film is thin and thus can be easily cut. The component accommodating cavity 53 formed by removing the release film 50 and a part of the second resin insulating layer 20 on the release film 50 is formed according to a size of the electronic component 71 (see FIG. 1) to be mounted However, the component accommodating cavity 53 is formed to have a relatively large lateral width and a not so large depth. Further, the through hole 52 is formed for communicatively connecting a functional surface of the electronic component 71 to be mounted to outside, and thus, corresponds to an area of a part of an area of the electronic component. Therefore, the component accommodating cavity 53 has a large lateral width and a small vertical direction length. On the other hand, the through hole 52 has a small area and a relatively large vertical direction length. Therefore, the component accommodating cavity 53 has a small aspect ratio, and the through hole 52 has an aspect ratio larger than that of the component accommodating cavity 53. The component accommodating cavity 53 is formed, and on a bottom surface of the component accommodating cavity 53, the electronic component mounting pads (122a) covered around by the solder resist layer 41 and the frame-shaped land (122b) for stopping laser are exposed.

Figure 2M:
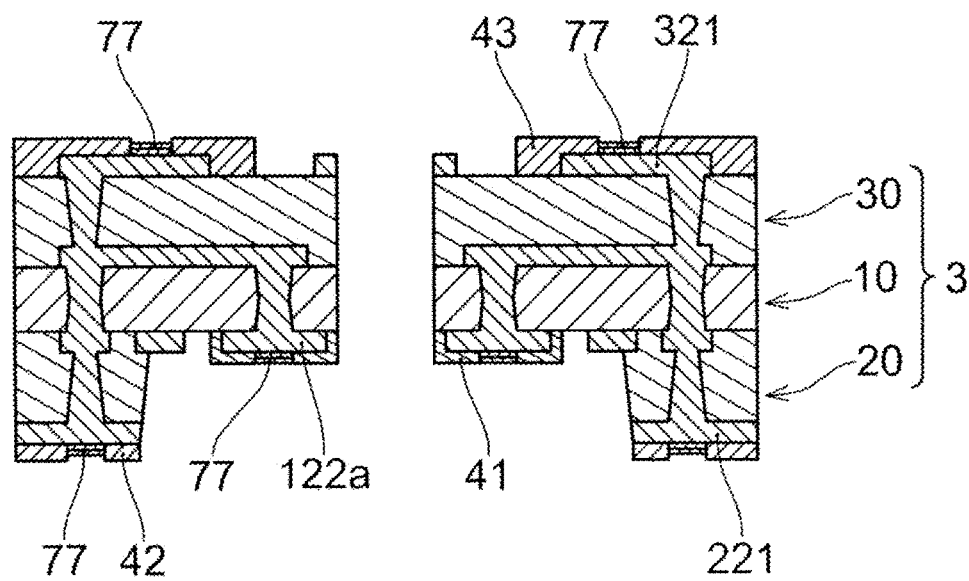
FIG. 2M is a cross-sectional view illustrating an example of the method for manufacturing the printed wiring board of the embodiment.

Then, as illustrated in FIG. 2M, a surface protective film 77 is formed on each of the portions of the first conductor layer 12, the second conductor layer 22 and the third conductor layer 32 that are not covered by the solder resist layers (41-43) and are exposed, that is, in each of the openings (41a, 42a, 43a) of the solder resist layers (41-43) of the pads (122a, 221, 321). As described above, for the surface protective film 77, for example, a surface protective film composed of Ni/Au, Ni/Pd/Au, Sn or the like can be formed by plating. It is also possible that an OSP is formed by immersion in a liquid protective material or the like. As described above, a surface protective film may be formed on the inner wall of the component accommodating cavity 53.

Figure 2N:
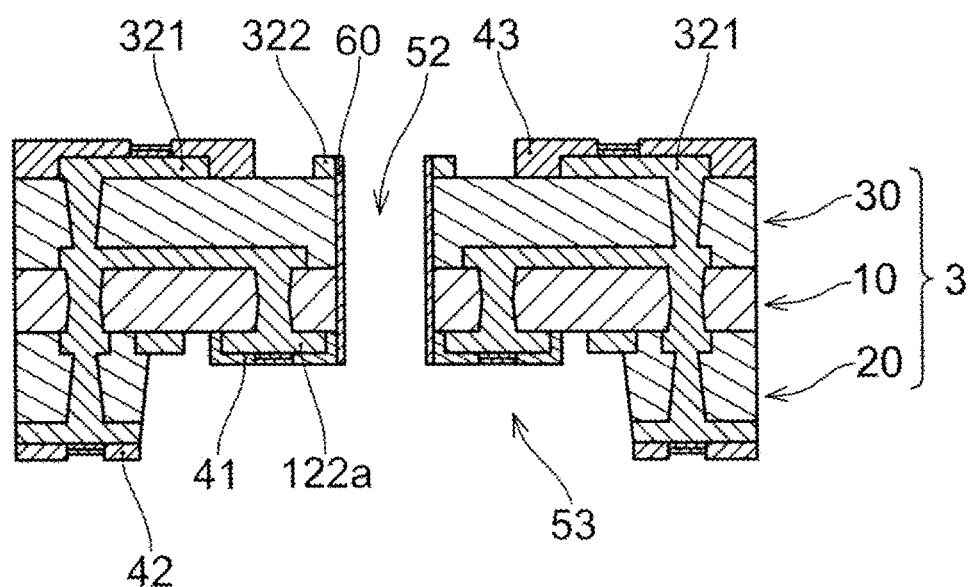
FIG. 2N is a cross-sectional view illustrating an example of the method for manufacturing the printed wiring board of the embodiment.

As illustrated FIG. 2N, the resin coating 60 is formed by coating a resin on the inner wall surface of the through hole 52 which is formed by forming the opening (52a) leading to the component accommodating cavity 53. As described above, the resin coating 60 is formed by spraying, coating, or using other film formation methods so as to have a smooth surface. Through the above processes, the printed wiring board 1 of the present embodiment is obtained.

In the printed wiring board 1, as illustrated in FIG. 1, the plate-like member 75 such as a lens may be bonded to the attaching part 322. As described above, the attaching part 322 may be formed by a portion of the third conductor layer 32. For example, a recess having a size matching an external shape of the plate-like member 75 such as a lens may be formed in the third resin insulating layer, or an opening matching a size of the plate-like member 75 may be formed by the solder resist layer 43. The plate-like member 75 may not be essential, and the through hole 52 may be in an open state. However, it is thought that, depending on a function of the electronic component 71, by having the plate-like member 75 that enhances the function, characteristics of the electronic component 71 can be improved. For example, when the electronic component 71 such as an image sensor chip is used to receive light, it is preferable to condense light using a lens or the like. Further, from a point of view of preventing adhesion of dust or the like to the electronic component 71, it is preferable to provide some shielding. In the printed wiring board 1, as indicated by the two-dot chain line in FIG. 1, the electronic component 71 such as an image sensor chip is mounted in the component accommodating cavity 53. Further, other electronic components (72, 73) such as a capacitor, a resistor and the like can be mounted to connect to the third conductor layer 32 of the second build-up layer 30.

In the above-described example, the through hole 52 leading to the component accommodating cavity 53 is formed by forming an opening using a router or a drill until the opening penetrates to the first build-up layer 20. However, it is also possible that the opening (52a) is formed, for example, by scraping with a drill or a router as in a counterbore method until the opening penetrates the first resin insulating layer 11 of the core substrate 10 and the release film 50 is exposed, and thereafter, the release film 50 is pushed with a pin or the like from the opening (52a) side toward the second surface (3B) side. By doing so, by using the releasing property of the release film 50, the removal portion (P) surrounded by the release film 50 and the separation groove (21b) of the first build-up layer 20 is easily removed. This is described with reference to FIG. 3A-3C.

FIG. 3A is a diagram illustrated in FIG. 2I, and, in FIG. 3A, a portion to be subjected to counterbore machining is indicated using a two-dot chain line (Z). Then, for example, a state in which the portion (Z) is scraped off using a drill is illustrated in FIG. 3B. That is, portions of the second build-up layer 30 and the first resin insulating layer 11 of the core substrate 10 are scraped off to expose the release film 50, and the opening (52a) is formed. In this state, the exposed release film 50 is pushed using a pin or the like (not illustrated in the drawings) from the opening (52a) side. As described above, since adhesion between the release film 50 and the first conductor layer 12 or the solder resist layer 41 is weak, the release film 50 is easily peeled off, and, as illustrated in FIG. 3C, the component accommodating cavity 53 and the through hole 52 are simultaneously formed. That is, the same structure as that of FIG. 2L described above is obtained, and subsequent processes are performed in the same way as in the above-described example.

Figure 4A:
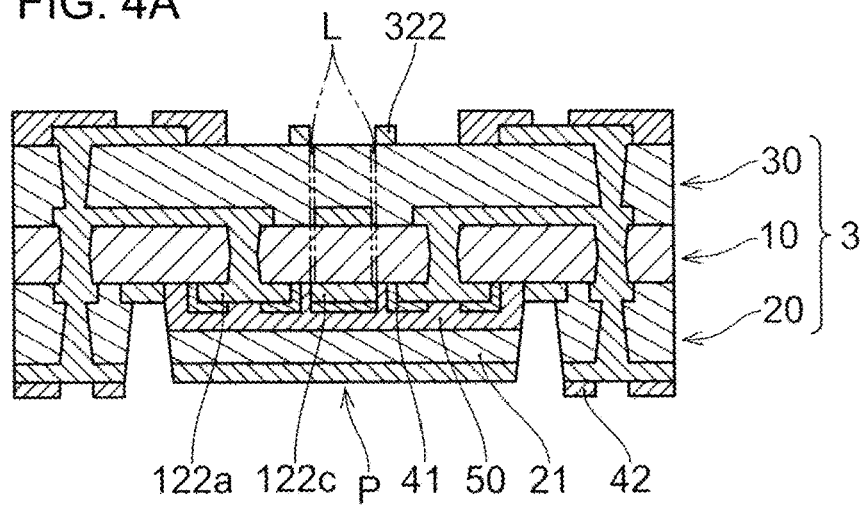
FIG. 4A illustrates yet another embodiment of a method for forming the component accommodating cavity of FIG. 2L.
Figure 4B:
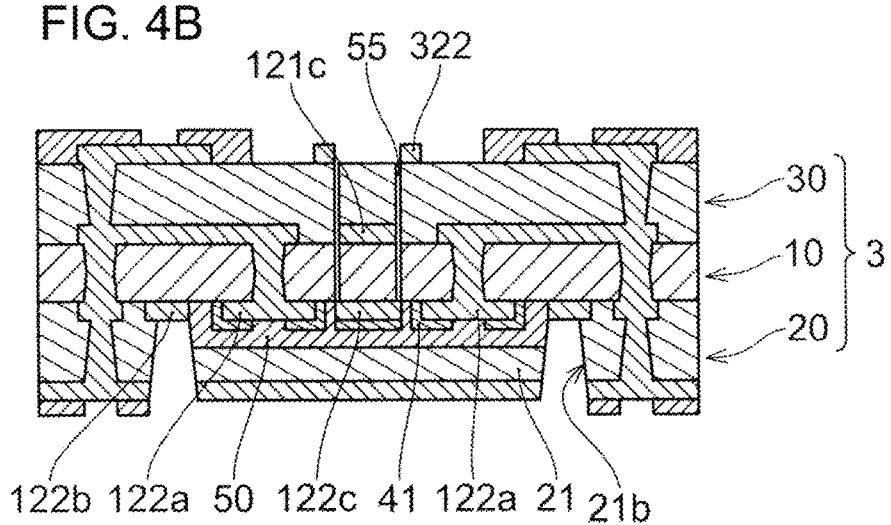
FIG. 4B illustrates the yet another embodiment of the method for forming the component accommodating cavity of FIG. 2L.
Figure 4C:
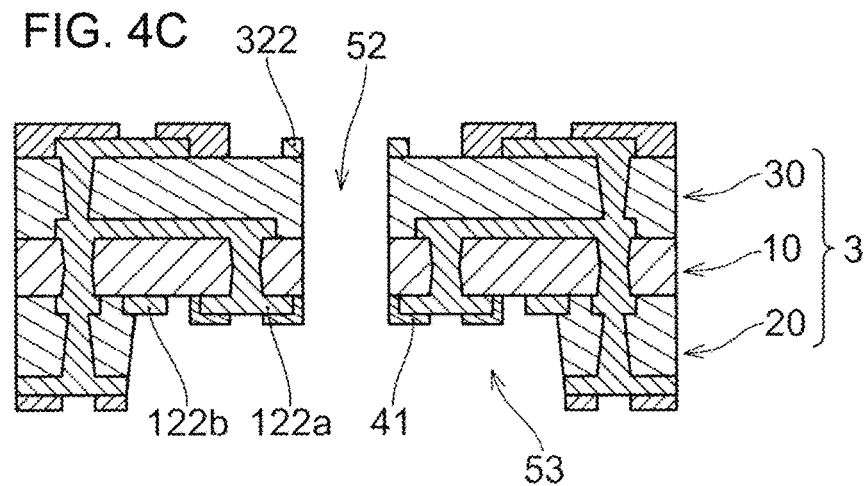
FIG. 4C illustrates the yet another embodiment of the method for forming the component accommodating cavity of FIG. 2L.

Another example of the method for forming the through hole 52 and the component accommodating cavity 53 is illustrated in FIG. 4A-4C. In this example, an opening groove 55 is formed around the through hole 52 using laser. By pushing out the portion surrounded by the opening groove 55, the portion surrounded by the groove 55 falls out together with the release film 50 and a portion of the first build-up layer 20. The through hole 52 and the component accommodating cavity 53 are simultaneously formed. That is, as illustrated in FIG. 4A in which a laser irradiation region (L) is indicated, laser is irradiation along the periphery of the through hole 52 to be formed, and an opening groove 55 is formed (see FIG. 4B). The opening groove 55 is formed so as to penetrate the first resin insulating layer 11 of the core substrate 10. That is, the second pattern 122 is formed such that laser is stopped by a frame-shaped land (122c) formed at a center portion of the second pattern 122 of the first conductor layer 12. In this example, a land (121c) is also formed at a portion of the first pattern 121 of the first conductor layer 12 in the through hole 52. However, this is not required. Even when the land (121c) is formed, the land (121c) is formed so as to be on an inner side of a range where the groove 55 is formed. Therefore, laser is not blocked. Thereafter, by pushing with a pin or the like (not illustrated in the drawings) from an upper surface of the portion surrounded by the groove 55 of the third resin insulating layer 31, the release film 50 portion is peeled off. A removal portion (P) of a center portion of the laminate 3 is removed, and, as illustrated in FIG. 4C, the through hole 52 and the component accommodating cavity 53 are simultaneously formed. The state in which the through hole 52 and the component accommodating cavity 53 are formed is the same as the above-described structure illustrated in FIG. 2L, and subsequent processes are performed in the same was as in the above-described example.

According to the methods illustrated in FIG. 3A-3C and FIG. 4A-4C, after the formation of the opening (52a) or the groove 55, it is simply to push the portion in the opening (52a) or the portion surrounded by the groove 55. Therefore, the through hole 52 and the component accommodating cavity 53 can be easily formed. In particular, in a case where multiple printed wiring boards 1 in an arranged state flow in a manufacturing process, by using a jig or the like having multiple pins arranged corresponding to the multiple printed wiring boards, multiple component accommodating cavities 53 can be simultaneously formed. The printed wiring board having the component accommodating cavity can be efficiently manufactured.

In the method of Japanese Patent Laid-Open Publication No. 2014-103401, the sensor element chip is embedded in the second insulating layer, and a functional surface of the sensor element chip faces outside through the opening part of the first insulating layer and the lens on a front side of the opening part. However, the opening formed in the first insulating layer is formed, for example, by processing using a drill or a router. The insulating layer is formed of a rigid insulating resin such as an epoxy resin. Further, a reinforcing material such as a glass cloth is contained. Therefore, a side surface of the opening becomes a rough surface scraped using a drill or the like, and unevenness of the resin and end portions of the reinforcing material are exposed. As a result, it is expected that a part of the insulating resin and a part of the reinforcing material may be peeled off from the side surface of the opening part and fall onto the functional surface of the sensor element chip. In a case where the sensor element chip is a solid-state image pickup element chip, even when a small amount of dust falls and adheres to the solid-state image pickup element chip, a problem can occur that an image pickup screen becomes blurred. It is thought that these characteristics are affected even when the sensor element chip is a microphone or ultrasonic transceiver or is a piezoelectric transducer.

A printed wiring board according to an embodiment of the present invention includes: a laminate in which resin insulating layers and conductor layers are alternately laminated and that has a first surface and a second surface on an opposite side with respect to the first surface; a component accommodating cavity that has an opening part on the second surface of the laminate; and a through hole that opens to the first surface of the laminate and leads to the component accommodating cavity. A resin coating is formed on an inner wall surface of the through hole.

A printed wiring board manufacturing method according to an embodiment of the present invention includes: forming electronic component mounting pads on the other side of a core substrate that respectively has conductor layers on both sides (one side and the other side which is on an opposite side with respect to the one side) of a resin insulating layer; forming a release film on the electronic component mounting pads; forming a laminate by respectively forming build-up layers on both sides of the core substrate; forming a separation groove by cutting, using laser, a portion of the laminate such that a side surface of the release film is exposed from a second surface which is a surface of the laminate on a side where the release film is formed; forming an opening in the laminate such that the opening penetrates at least the resin insulating layer of the core substrate from a first surface which is a surface of the laminate on an opposite side with respect to the side where the release film is formed; forming a component accommodating cavity by removing the build-up layer formed on the release film together with the release film; and forming a coating resin layer on an inner wall surface of a through hole which is formed by forming the opening leading to the component accommodating cavity.

According to an embodiment of the present invention, the resin coating is formed on the inner wall surface of the through hole leading to the component accommodating cavity. As a result, a scraped wall surface due to the formation of the through hole is not directly exposed. Therefore, it is thought that the problem that dust peels off from the inner wall of the through hole does not occur. That is, adhesion of foreign substances to a functional surface of an electronic component can be prevented.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a laminate comprising a plurality of resin insulating layers and a plurality of conductor layers such that the resin insulating layers and the conductor layers are laminated alternately and that the laminate has a through hole opening to a first surface of the laminate and a component accommodating cavity configured to accommodate an electronic component and having an opening part formed on a second surface of the laminate on an opposite side with respect to the first surface,
wherein the through hole is formed through the laminate such that the through hole is extending to the component accommodating cavity, and the laminate has a resin coating formed on an inner wall surface of the through hole.

2. A printed wiring board according to claim 1, wherein the laminate includes an electronic component mounting pad structure formed at a peripheral edge portion of the through hole on a bottom surface in the component accommodating cavity such that the electronic component mounting pad structure is positioned to mount the electronic component in the component accommodating cavity.

3. A printed wiring board according to claim 2, wherein the laminate includes a frame-shaped land structure formed on the bottom surface in the component accommodating cavity such that the frame-shaped land structure is positioned around an outer periphery of the electronic component mounting pad structure.

4. A printed wiring board according to claim 3, wherein the frame-shaped land structure is formed on the bottom surface in the component accommodating cavity such that the frame-shaped land structure is a ring-shaped land continuously formed around the outer periphery of the electronic component mounting pad structure.

5. A printed wiring board according to claim 4, wherein the laminate includes a bypass conductor pattern formed such that the bypass conductor pattern is formed through inner resin insulating layers of the laminate and connecting the electronic component mounting pad structure to a conductor pattern formed outside the component accommodating cavity by bypassing the frame-shaped land structure.

6. A printed wiring board according to claim 1, wherein the laminate includes plating film formed on an inner wall surface forming the component accommodating cavity.

7. A printed wiring board according to claim 1, wherein the laminate is formed such that the component accommodating cavity has an aspect ratio that is lower than an aspect ratio of the through hole.

8. A printed wiring board according to claim 1, wherein the laminate includes an attaching structure formed on the first surface of the laminate such that the attaching structure is configured to fix a plate-like member on an opening of the through hole on the first surface of the laminate.

9. A printed wiring board according to claim 2, wherein the electronic component mounting pad structure comprises a plurality of electronic component mounting pads.

10. A printed wiring board according to claim 2, wherein the laminate includes plating film formed on an inner wall surface forming the component accommodating cavity.

11. A printed wiring board according to claim 2, wherein the laminate is formed such that the component accommodating cavity has an aspect ratio that is lower than an aspect ratio of the through hole.

12. A printed wiring board according to claim 2, wherein the laminate includes an attaching structure formed on the first surface of the laminate such that the attaching structure is configured to fix a plate-like member on an opening of the through hole on the first surface of the laminate.

13. A printed wiring board according to claim 3, wherein the electronic component mounting pad structure comprises a plurality of electronic component mounting pads.

14. A printed wiring board according to claim 3, wherein the laminate includes plating film formed on an inner wall surface forming the component accommodating cavity.

15. A printed wiring board according to claim 3, wherein the laminate is formed such that the component accommodating cavity has an aspect ratio that is lower than an aspect ratio of the through hole.

* * * * *